United States Patent
Iyer et al.

(10) Patent No.: US 7,181,352 B2
(45) Date of Patent: Feb. 20, 2007

(54) METHOD OF DETERMINING CURRENT-VOLTAGE CHARACTERISTICS OF A DEVICE

(75) Inventors: Natarajan Mahadeva Iyer, Leuven (BE); Steven Thijs, Willebroek (BE); Vesselin K. Vassilev, Leuven (BE); Tom Daenen, Leuven (BE); Vincent De Heyn, Braives (BE)

(73) Assignee: Interuniversitaire Microelektronica Centrum (IMEC) vzw, Leuven (BE)

( * ) Notice: Subject to any disclaimer, the term of this patent is extended or adjusted under 35 U.S.C. 154(b) by 27 days.

(21) Appl. No.: 10/817,764

(22) Filed: Apr. 2, 2004

(65) Prior Publication Data

US 2004/0239346 A1    Dec. 2, 2004

Related U.S. Application Data

(60) Provisional application No. 60/460,854, filed on Apr. 4, 2003.

(30) Foreign Application Priority Data

May 23, 2003  (EP) ................................. 03447121

(51) Int. Cl.
*G06F 19/00* (2006.01)

(52) U.S. Cl. ........................................ 702/65; 324/522

(58) Field of Classification Search ............... 702/64, 702/182–185, 188, 65; 324/500, 512, 522, 324/525, 532, 750, 755–757, 765, 769, 771, 324/712, 109, 523
See application file for complete search history.

(56) References Cited

U.S. PATENT DOCUMENTS 4,080,571 A * 3/1978 Weisbrod ..................... 324/767
2004/0233713 A1 * 11/2004 Iwase et al. ............. 365/185.2

OTHER PUBLICATIONS

Maloney, et al., "Transmission line pulsing techniques for circuit modeling of ESD phenomena", EOS/ESD Symposium, pp. 49–54, Sep. 1985.

* cited by examiner

*Primary Examiner*—Edward Raymond
(74) *Attorney, Agent, or Firm*—Knobbe Martens Olson & Bear LLP

(57) ABSTRACT

A method and system for evaluating the current-voltage characteristics of devices where negative resistance behavior is observed. More particularly the present invention relates to a method and system for evaluating accurately the electrical overstress or ESD performance of semiconductor devices during the voltage transition region (positive to negative). The method comprises applying a signal comprising at least two amplitudes within the pulse. By suitably adjusting the amplitude of the first level, such that it is high enough to trigger the device-under-test, and subsequently applying one or more levels within the same signal while keeping the device-under-test in the on-state, the device IV characteristics can be comprehensively extracted, without being limited by the system loadline. The method may use a rectangular pulse testing set-up, also known as transmission line measurement set-up, with a single loadline characteristic to determine a portion or the complete ESD characteristic of the device-under test.

20 Claims, 13 Drawing Sheets

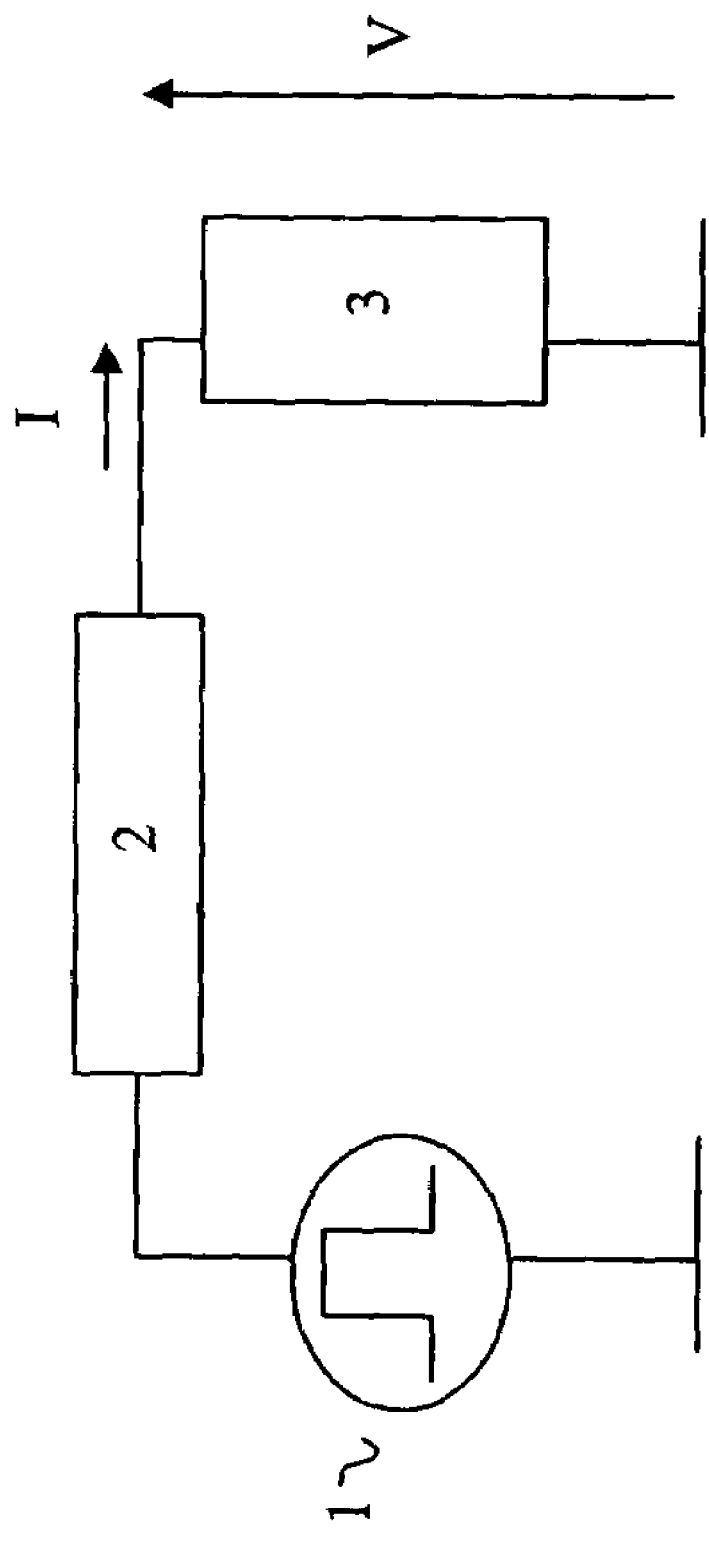
Figure 1: prior art

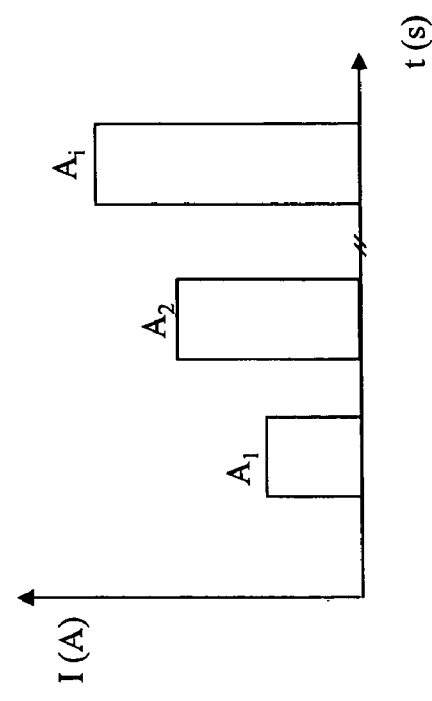
Figure 2b: prior art
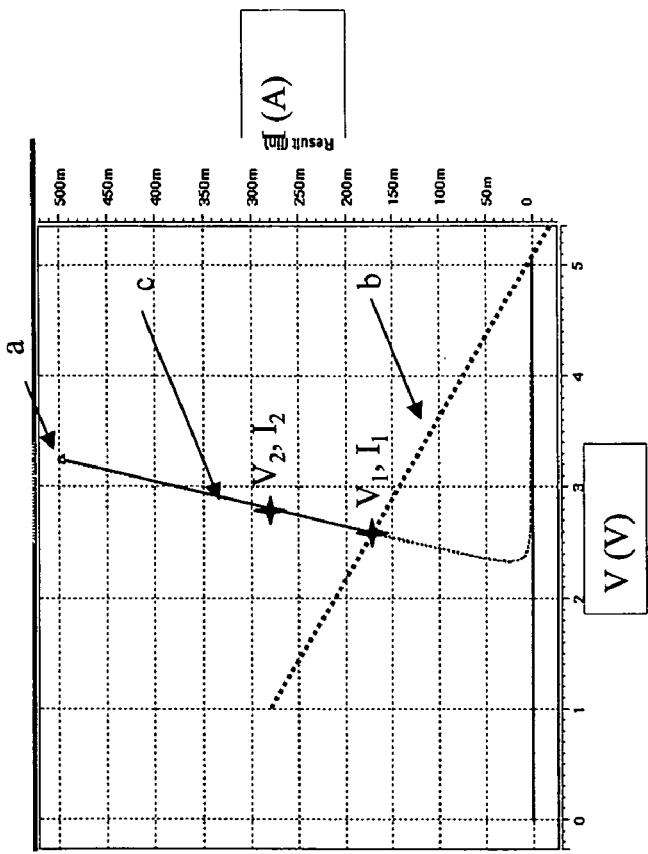
Figure 2a: prior art

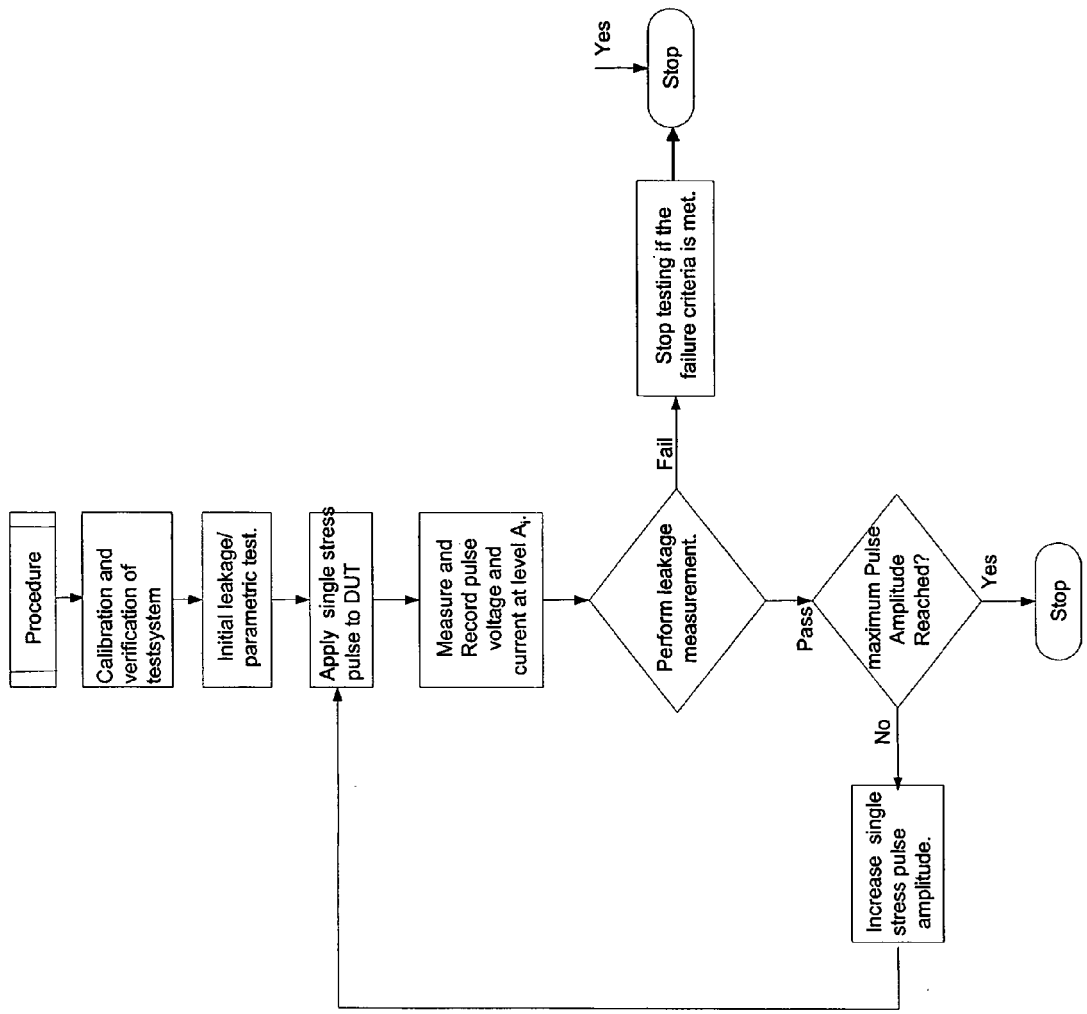
Figure 2c: prior art

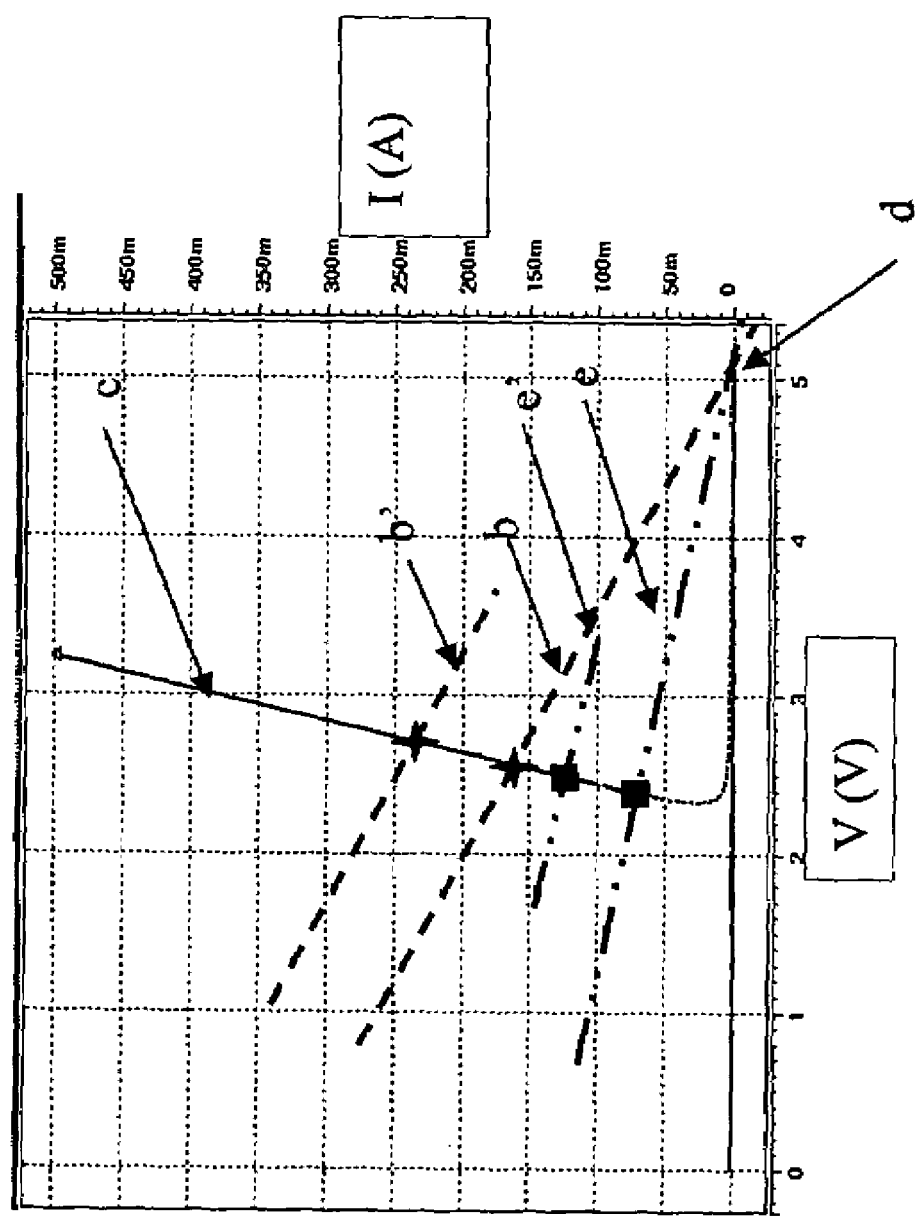
Figure 2d: prior art

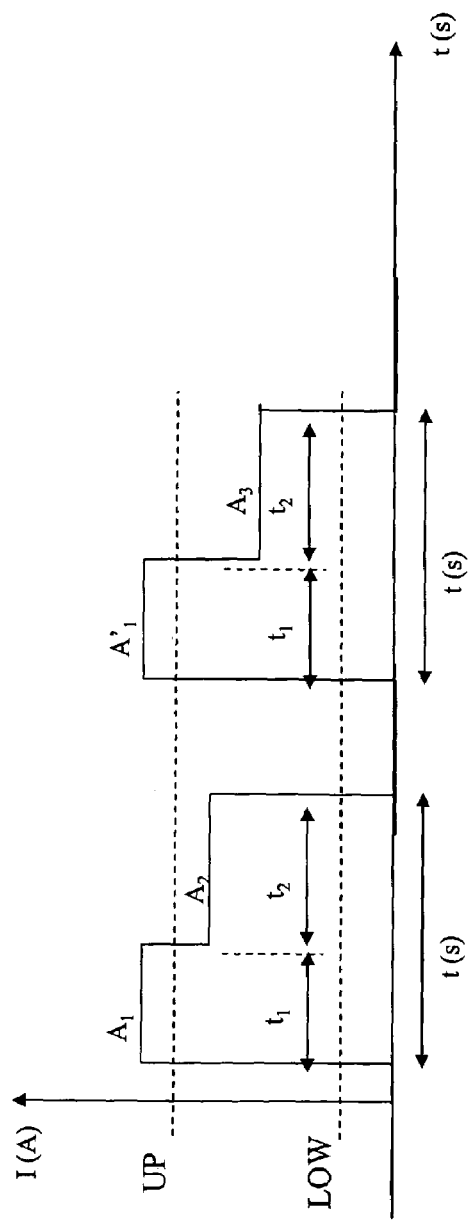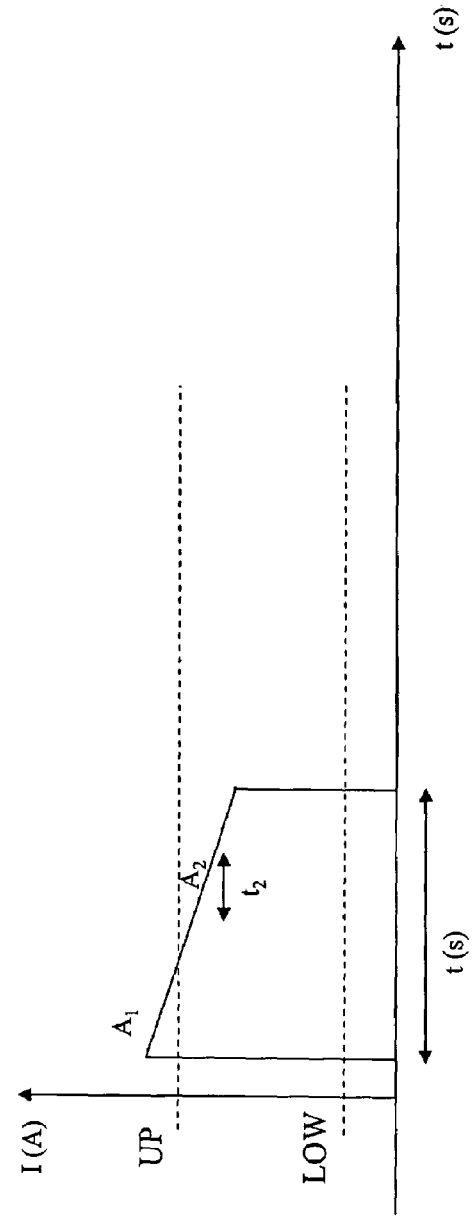
Figure 6a:
Figure 6b:

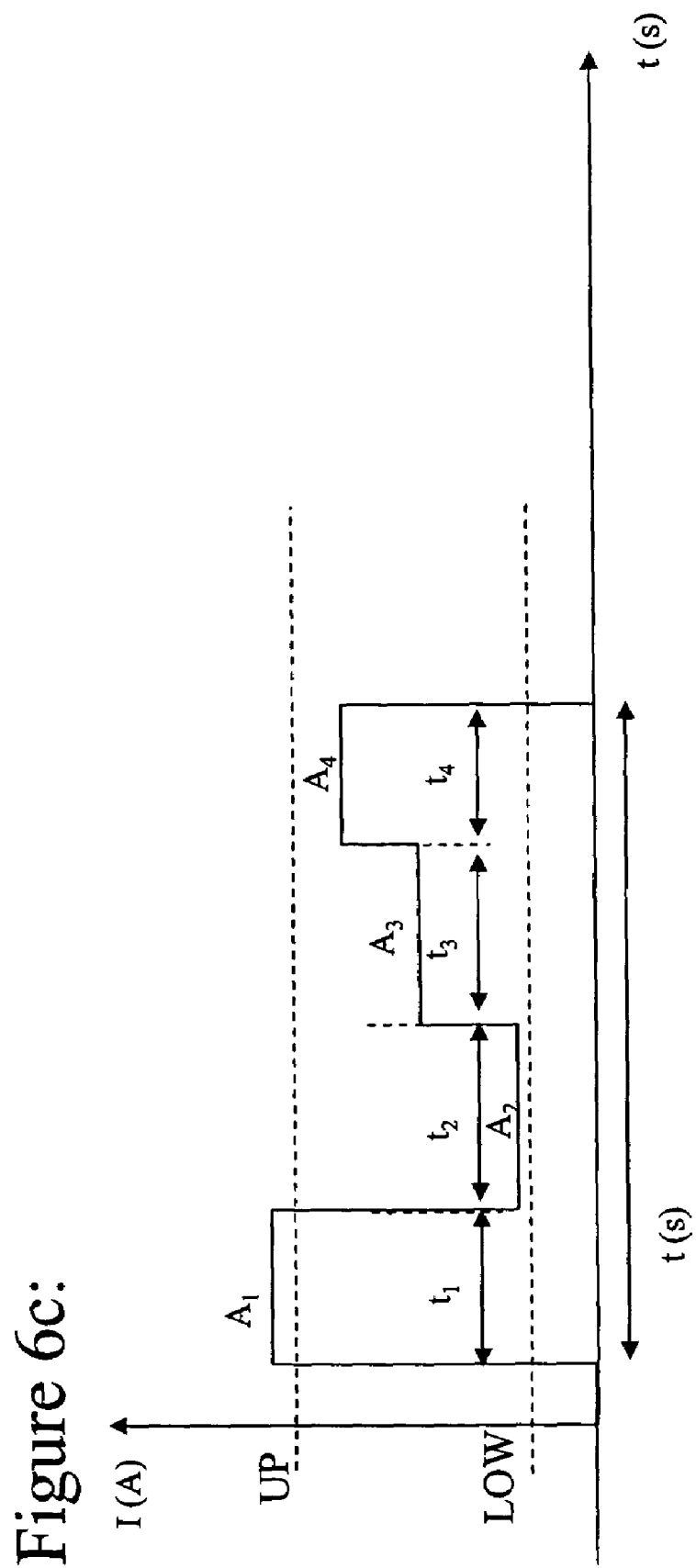

METHOD OF DETERMINING CURRENT-VOLTAGE CHARACTERISTICS OF A DEVICE

RELATED APPLICATIONS

This application claims priority to, and hereby incorporates the entire disclosure of, co-pending U.S. provisional application No. 60/460,854, filed Apr. 4, 2003, and entitled "COMPREHENSIVE METHOD FOR DETERMINING THE CURRENT VOLTAGE CHARACTERISTICS OF DEVICES UNDER ELECTRICAL OVERSTRESS OR ELECTROSTATIC DISCHARGE CONDITIONS." This application also claims priority to and incorporates by reference European application number EP 03447121.9, filed May 23, 2003.

FIELD OF THE INVENTION

The present invention relates generally to methods and systems for determining the electrostatic discharge or electrical overstress behavior of semiconductor devices and integrated circuits. More particularly the present invention relates to a method of using or more rectangular or other-shaped pulses for characterizing and optimizing the robustness of semiconductor devices against damage induced by electrostatic discharge phenomena.

BACKGROUND OF THE INVENTION

Electro Static Discharge or ESD can be defined as "the transfer of an electrostatic charge between bodies at different electrostatic potentials or voltages, caused by direct contact or induced by an electrostatic field." This transfer of charge towards electrical or electronic devices or circuits may damage such devices or circuits as the electrostatic field associated with this charge might cause the semiconductor junctions or isolation or insulation media used in such device or circuits to break down. ESD is a subset of electrical overstress events that to which devices might be subjected, either at device level, for discrete components, integrated devices or at system level.

ESD damage to electronic component and assemblies has been a major problem of the electronics industry in recent years because high frequency and highly miniaturized active components are especially prone to damage by ESD. ESD can damage all electronic parts, components, and subassemblies at all manufacturing and handling stages. It affects production yields, manufacturing costs, product quality, reliability, and profitability. While only a few components will be catastrophically damaged to an extent where they fail completely, many more may suffer damage that is not immediately apparent. These latent failures will cause premature failure in the field, with huge associated costs. Thus, ESD impacts productivity and product reliability in all aspects of the electronic environment. In view of all this, the importance of effective ESD prevention cannot be overemphasized as the performance of integrated circuits and printed circuit boards can be affected by ESD.

There are techniques that may be applied at integrated circuit level to protect high performance integrated circuits against electrical overstress events such as ESD. Among these techniques is the use of on-chip ESD protection circuits comprising devices having a non-linear current-voltage characteristic comprising at least one voltage range exhibiting a negative coefficient of resistance, such behavior being called snap-back behavior. These ESD devices can be semiconductor based such as silicon resistors, silicon-rectifier-circuits (SCR), Field Effect Transistors (FET), bipolar transistors etc . . . Also non-silicon based devices such as polymer ESD protection devices, gas tube arresters exist as an alternative to the semiconductor-based devices. During the snap-back action the device is triggered at a higher, triggering, voltage, resulting in a rapid increase of the current flow through the device and moves to a lower, holding, voltage regime. During this transition from high to low voltage regimes the device manifest a negative resistance behavior whereby the voltage across the device drops instantaneously without any decrease in current. When devices which exhibits snap-back behavior are used as ESD protection devices, the energy of the ESD event is shunted towards the voltage supply lines or dedicated ESD power rails during this transition from high impedance to low impedance. The trigger voltage, the holding voltage and the shape of the snap-back curve are characteristic for each device. The design of adequate on or off-chip ESD protection circuits providing appropriate ESD protection therefore requires insight in the complete behavior of these semiconductor devices under ESD conditions. There are several well-known ESD models that attempt to simulate, under a controlled environment, the nature of such an ESD event. These ESD models include the Human Body Model (HBM), which seeks to emulate the conditions of a contact by touch; the Machine Model (MM), which emulates well the discharge from a machine or cable; and the Charged Device Model (CDM), in which the device itself discharges into a probe. Each of these models will yield a characteristic figure that allows a designer to qualify the ESD performance of a design.

Other techniques to determine the ESD behavior of such non-linear ESD devices are being developed which may use of rectangular pulse testers, also known as transmission line pulsing (TLP) testers. An explanation about the testing and modeling of snap back devices with transmission line derived pulses is given by Maloney et al. in "Transmission line pulsing techniques for circuit modeling of ESD phenomena.", EOS/ESD symposium September 1985 pp 49–54. Such a TLP tester employs a single rectangular pulse with pulse width representing an ESD-like event in the ESD time domain. These pulses typically have a pulse width varying between 75 and 200 nanoseconds. An advantage of using TLP is that it provides an understanding of the high-current behavior of the device and of the ESD performance of each ESD protection component that is being tested. Based on this analysis, the ESD protection components can subsequently be used to develop optimal protection circuit designs. TLP can also serve as an effective tool for debugging ESD failures in product chips.

Although the Human Body Model is a standardized and well-documented characterization technique, transmission line pulse (TLP) testing has become a popular approach. The advantage of TLP over HBM is that TLP simulates the ESD stress but at a quasi-static condition thereby avoiding the dynamics of the pulses of ESD phenomena occurring in the device-under-test (DUT). Further, both techniques can be correlated under specific measurement conditions.

The rectangular pulses used in TLP testing can be obtained by using a pulse generator in conjunction with a transmission line or by using a transmission line and a suitable high voltage supply. Depending on the system-impedance and architecture the signal pulse may or may not be subject to a current transformation action. Although each combination of impedance and architecture will have its own limitations, all such TLP systems will determine essentially the same ESD parameters of the device-under-test. FIG. 1 shows a prior art TLP measurement set-up. A high voltage power supply (1) generates a voltage of specific amplitude and for a specific duration. This voltage is used to charge a cable (2), e.g. 50-Ohm impedance line, to a certain voltage level. This process will transform the applied voltage into current. The charged cable is then subsequently discharged into the device-under-test (3) while measuring the current ($I_{i1}$) through and the voltage difference ($V_i$) over this ESD component (3). The thus obtained current ($I_i$)—voltage ($V_i$) measurement data can be plotted in a current-voltage curve as shown in FIG. 2a. This test sequence may be repeated with pulses showing successively increasing pulse amplitudes, each test sequence yielding a current ($I_i$) and voltage ($V_i$) value. An example of such pulse sequence is shown in FIG. 2b, showing a sequence of pulses, each pulse has higher amplitude than its predecessor. After each such pulse, the leakage current through the device is measured using known and often standardized DC measurement methods. The device is considered to be failed once this leakage current exceeds a pre-defined threshold value. Point (a) in FIG. 2a corresponds then to the maximal applicable ESD signal or pulse before failure. The thus obtained current-voltage data are used to generate a current-voltage characteristic that ideally corresponds to the real current-voltage (c) or snap-back characteristic of the ESD component. The flow chart given in FIG. 2c recites the steps performed in obtaining the I-V characteristic.

Although with this test sequence the signal, i.e., current or voltage level can be determined at which the device fails (point a in FIG. 2a), this test sequence cannot provide all the relevant ESD properties of the device under test. Depending on the characteristics of the device (3) and of the measurement set-up (1,2) portions of the device current-voltage curve (c) cannot be measured. This deficiency is illustrated in FIG. 2d. For a given measurement set-up, having a loadline (b), the first point on the part of the current-voltage curve can be measured will be at the intersection (star) of system characteristic (b) and of the device characteristic (c). In FIG. 2d the trigger point is marked as "d" and corresponds to the known parameters $V_{t1}$ and $I_{t1}$ value of an ESD characterization When applying a second TLP signal with increased amplitude a second point can be measured as being the intersection of the upwards shifted loadline (b') and of the device characteristic (c) and so on. For this measurement set-up it is not possible to determine that portion of the device characteristic (c) below the initial loadline (b), because this would imply the use of pulse amplitudes which will not result in a voltage above the trigger voltage (point d in FIG. 2d) of the device (3) and hence the device (3) would not even be triggered. Depending on the ESD component (3) to be tested one could select a measurement set-up or TLP system having an appropriate loadline depending on the snapback curve (c) of the device (3) to be tested, e.g. choose between a measurement set-up having loadline (b) or one having loadline (e). One could also use a measurement set-up with tunable load line specifications, e.g. loadline (b) as well as loadline (e) in FIG. 2d. Such approaches would require the use of expensive or multiple TLP testers, while the correlation of the measurement results corresponding to the various testers with different loadlines would pose another problem to be solved.

SUMMARY OF THE INVENTION

The present invention is related to a method for determining the current voltage characteristic of a device, said current voltage characteristic comprising at least one negative resistance region, said method comprising the steps of: triggering said device in the low-impedance state, while being in said low-impedance state applying at least one pulse signal of a predetermined time period to said device, said pulse signal comprising at least two consecutive levels, each level having a predetermined amplitude and a predetermined pulse width, measuring, at least at the second level of said two consecutive levels, the current through and the voltage across said device, characterized in that said predetermined amplitudes of said at least two consecutive levels are in a decreasing order.

Preferably the absolute value of the amplitude of the first level of said at least two consecutive levels correspond to the absolute value of the trigger voltage of said device.

Preferably the absolute value of the amplitude of the first level of said at least two consecutive levels is above the absolute value of the trigger voltage of said device.

More preferably the absolute value of the amplitude of the second level of said at least two consecutive levels is less than the absolute value of the trigger voltage of the device. Further, more preferably the absolute value of the amplitude of the second level of the said at least two consecutive levels is more than the absolute value of the trigger current required to retain the device in the low impedance state.

The present invention involves the use of test system, at least for applying said at least one pulse signal, said test system having a loadline and whereby with each of said predetermined amplitudes a position of said loadline on the current voltage characteristic of said device corresponds.

Preferably said position of said loadline on said current voltage characteristic is swept monotonically within said pulse signal.

According to a first embodiment, the first level of said at least two consecutive levels is the first level of the pulse signal.

In particularly, said predetermined time period is less than 1 second More particularly, said predetermined time period is less than 1 microsecond.

According to a preferred embodiment, the transition from the first level to the second level of said at least two consecutive levels is sloped.

According to an another preferred embodiment, the transition from the first level to the second level of said at least two consecutive levels is stepwise.

The method can further comprise the step of measuring the current through said device, after removing said pulse signal.

An other object of the present invention is related to the use of the method as described here above for determining the current voltage characteristic of a snap-back device.

An other object of the present invention is related to a computer program product executable on a computer device, said computer program being stored on a support and implementing the steps of the method described here above when said product is run.

In particular, the present invention is related to a computer program product executable on a computer device, said computer program being stored on a support and able to determine the current voltage characteristic of a device, said current voltage characteristic comprising at least one negative resistance region, implementing the steps of: inputting a threshold value, applying a test sequence comprising:

triggering said device in the low-impedance state, while being in said low-impedance state applying a pulse signal of a predetermined time period to said device, said pulse signal comprising at least two consecutive levels, each level having a predetermined amplitude and a predetermined pulse width and said predetermined amplitudes are in a decreasing order, measuring, at least at the second level of said two consecutive levels, the current through and the voltage across said device, outputting said measured current through and the voltage across the said device, thereafter measuring the leakage current through said device, outputting said leakage current, comparing said leakage current with said threshold value, and repeating said test sequence, thereby at least varying the amplitude of said second level, until said leakage current is above said threshold value.

BRIEF DESCRIPTION OF DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIG. 1 shows a transmission line pulse (TLP) measurement set-up according to the prior art.

FIGS. 2a and 2d show a typical snapback curve (c) of an ESD component and illustrate in FIGS. 2b and 2c the prior art measurement sequence for determining current-voltages points on this curve (c)

FIG. 6a–c show examples of a test signal according to embodiments of the present invention.

FIG. 8 shows an alternative measurement set-up capable of generating a pulse sequence as shown in FIG. 6a.

FIG. 9 shows an alternative measurement set-up capable of generating a pulse sequence as shown in FIG. 6a.

DESCRIPTION OF THE INVENTION

Figures 3A, 3B:
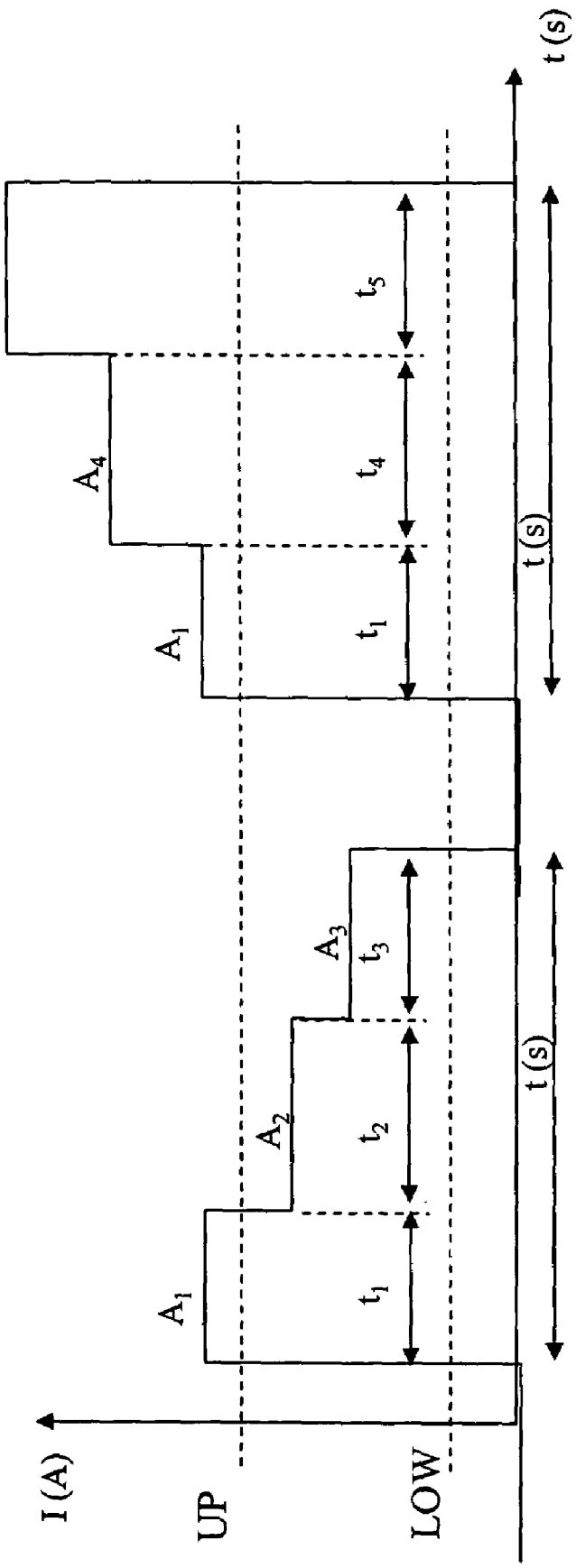
FIGS. 3a and 3b show examples of a test signal according to embodiments of the present invention.

In relation to the drawings the present invention is described in detail in the sequel. It is apparent however that a person skilled in the art can imagine several other equivalent embodiments or other ways of executing the present invention, the spirit and scope of the present invention being limited only by the terms of the claims.

36 The present invention allows determining in a more exhaustive way than obtained by the prior art the current voltage (I-V) curve of a device, this I-V curve comprising at least one negative resistance portion or snap-back region. Examples of devices displaying such behavior are devices under ESD conditions, semiconductor circuits under latch-up conditions, ESD protection devices. The present invention allow to determine inter alia the ESD or electrical overstress behavior and robustness of the various ESD protection components having different snap-back characteristics or the latch-up sensitivity of semiconductor devices or circuits.

In one embodiment, the method according to the invention requires a single TLP measurement set-up with a given and fixed loadline to determine this I-V curve. As the proposed invention doesn't necessarily require altering the configuration or specifications of the measurement set-up, the I-V curve can be measured in a cost- and time-effective way. As the proposed method alleviates the loadline limitation, which was experienced in the prior art TLP measurement methodologies, the proposed method will be more effective and complete in gathering the I-V data of a particular device or class of devices.

Within the scope of this disclosure the loadline or impedance of the measurement system is considered to be the impedance seen by the device-under-test. With pulse is meant a voltage or current pulse as one signal type can be transformed into the other signal type. In the remainder of the disclosure the general term signal is therefore used.

In a first aspect of the invention for the purpose of teaching the invention a method is disclosed to determine the ESD characteristics of an overvoltage protection device. This method comprises the steps of triggering the snap-back operation of this ESD device and afterwards maintaining the ESD device in a conductive and low impedance state. Throughout the description the wordings conductive state, low-impedance state, and on-state are used as synonyms. They identify that part of the current-voltage characteristic, comprising the negative resistance behavior, which state is distinguished from the off-state. The latter state is that part of the current-voltage characteristic wherein the response of the device is, as if essentially no signal were applied to the device. In case of an ESD device, the off-state is that part of the current-voltage characteristic before the trigger voltage is reached.

While being in this conductive state a sequence of different signal amplitudes is applied to the ESD device and corresponding current-voltage points of the device ESD characteristic are measured. This sequence of different amplitudes can be applied within the same pulse or in a sequence of consecutive pulses. This sequence of different signal amplitudes is characterized in that at least one signal amplitude is below the amplitude of the preceding signal.

Figure 4:
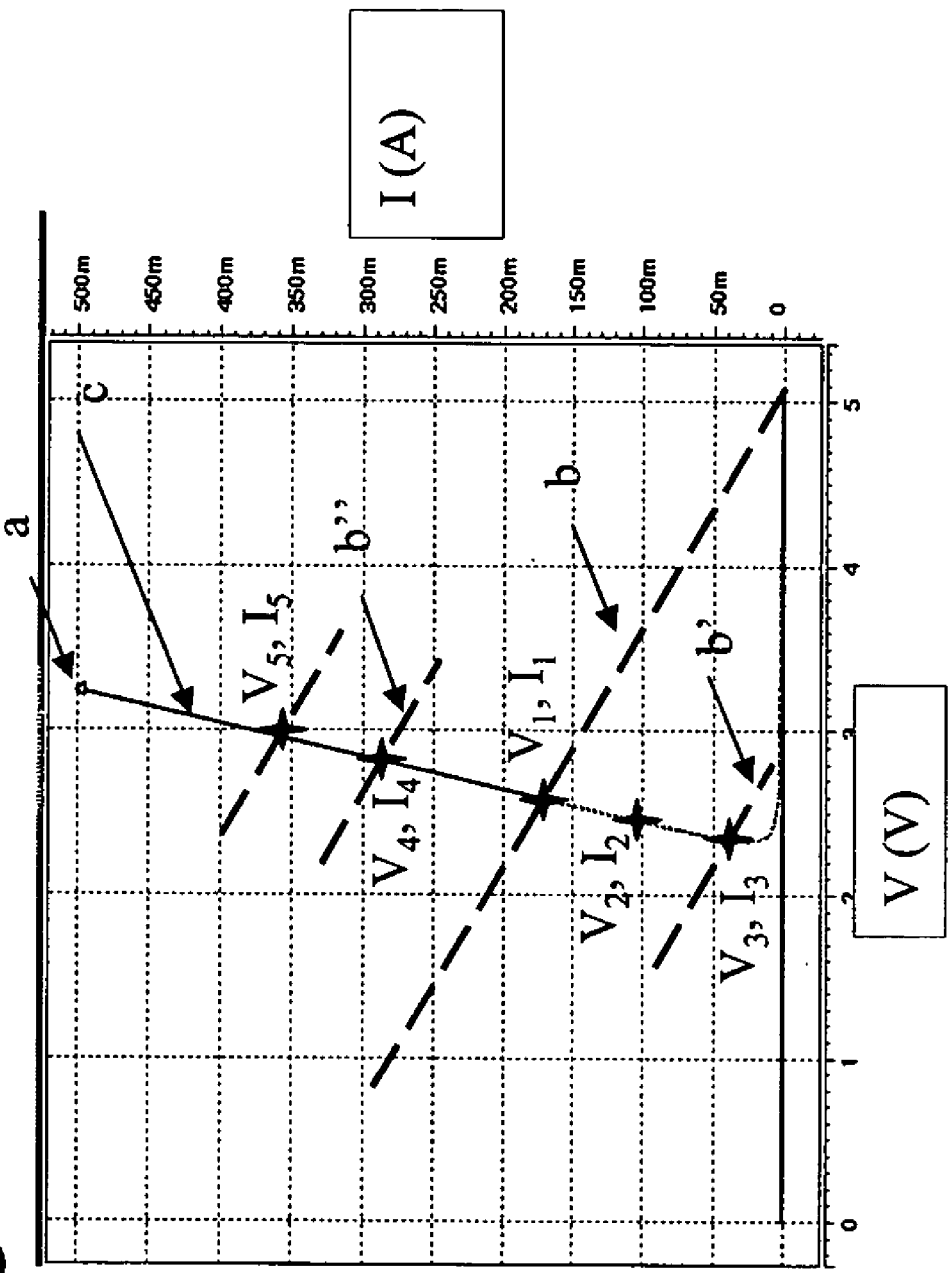
FIG. 4 shows a typical snapback curve (c) of an ESD component and illustrates the measurement sequence for determining current-voltages points on this curve (c) according to an embodiment of the present invention.
Figure 5:
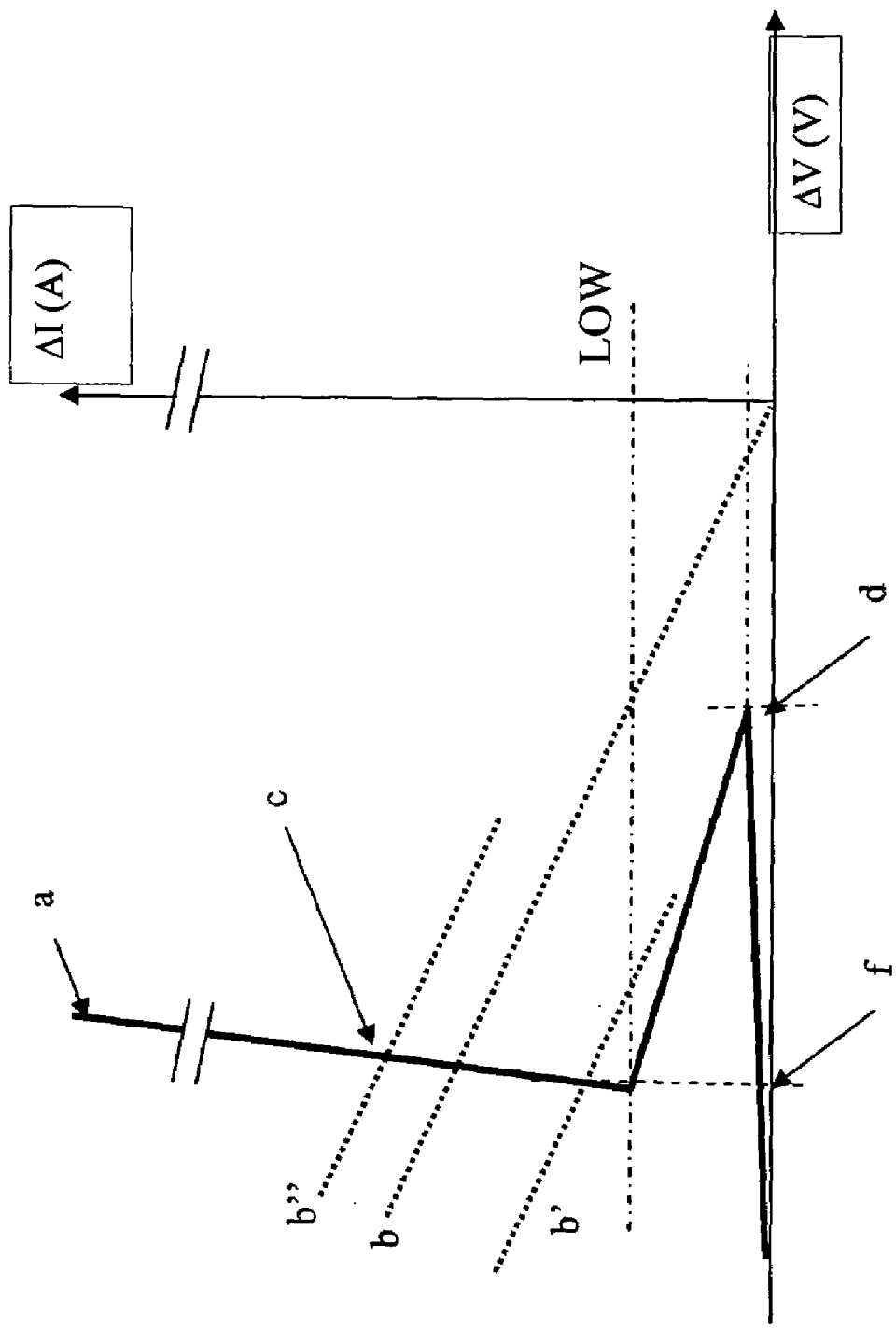
FIG. 5 shows a schematic subsection of a typical snapback curve (c) of an ESD component and illustrates the measurement sequence for determining current-voltages points on this curve (c) according to an embodiment of the present invention.

FIG. 3a shows an example of a test sequence according to the present invention. During the test sequence a signal is applied having first amplitude $A_1$ above a minimum signal level UP, required to the trigger the device-under-test. The first amplitude can be maintained during a first period or pulse width ti at least sufficient to perform a first current ($I_1$) and voltage ($V_1$) measurement. After this first period $t_1$ the amplitude of the signal is lowered to second amplitude $A_2$, above a maximum signal level LOW required to the keep the device-under-test in the conductive state. This second amplitude is maintained during a second period $t_2$ at least sufficient to perform a second current ($I_2$) and voltage ($V_2$) measurement. Likewise the amplitude of the signal can be again lowered to a third amplitude $A_3$, still above the maximum signal level LOW required to the keep the device-under-test in the conductive state. This third amplitude is maintained during a third period $t_3$ at least sufficient to perform a third current ($I_3$) and voltage ($V_3$) measurement. If the amplitude of the signal is lowered below the signal level LOW, the device-under-test (DUT) is being switched off and stops conducting current. The results of this measurement sequence can be plotted in a current-voltage plot similar to the one shown in FIG. 4. As mentioned before each current ($I_i$) and voltage ($V_i$) measurement performed on the device-under-test in a conductive state corresponds to the intersection of the loadline (b) of the measurement set-up, associated with the pulse level $A_i$, and of the device characteristic (c). The loadline (b) of the measurement system is determined by the open circuit voltage of the pulse source or TLP tester, generally described as test system. When the amplitude of the test signal provided by the TLP tester is lowered, the loadline (b') of the measurement system shifts downward parallel to its initial position (b). As the loadline (b') shifts to lower voltages, but provided the device is still in the on-state, the measurement system will be able to measure corresponding current ($I_i$) and voltage ($V_i$) values of the device characteristic which are below the values of the first measurement. FIG. 5 is a schematic representation of a current-voltage curve of an ESD device, which is to be tested according to the present invention. When the amplitude of the test signal applied to this device increases, but is still below a signal level UP, corresponding to the trigger point (d) the device, remains in the off-state and essentially no leakage current is flowing through the device-under-test. When however the amplitude of the applied test signal yields a voltage above the trigger voltage, corresponding to trigger point (d), the device breaks down and a sudden increase in the current is observed while the voltage across the device drops to the holding voltage, corresponding to the holding point (f). In the region between point (d) and (f) the device shows a negative resistance behavior, while from point (f) the current increases significantly for only a minor variation of the voltage. The region from point (f) onwards is called the holding voltage or low voltage region. If the test signal yields a current lower than the current needed the keep the device in the conductive state, the device switches off. Repeating the measurement sequence with decreasing amplitude levels, after the device has be triggered into an on-state, hence allows the accurate determination of the device characteristic down to the snapback point (d).

The current invention also allows determining the upper portion of the device characteristic (c). As shown in FIG. 4 the loadline can be shifted upwards with respect to the initial position (b) of the loadline, which corresponds to a test signal, having amplitude corresponding to the trigger voltage (d) of the device-under-test. During this test sequence a signal is applied having first amplitude Al above a minimum signal level UP required to the trigger the device-under-test. The first amplitude is maintained during a first period $t_1$ at least sufficient to perform a first current ($I_1$) and voltage ($V_1$) measurement. After this first period $t_1$ the amplitude of the signal is increased to second amplitude $A_4$. This second amplitude is maintained during a second period $t_4$ at least sufficient to perform a second current ($I_4$) and voltage ($V_4$) measurement. Likewise the amplitude of the signal can be again increased to a third amplitude $A_5$, still above a signal level LOW required to the keep the device-under-test in the conductive state. This third amplitude is maintained during a third period $t_5$ at least sufficient to perform a third current ($I_5$) and voltage ($V_5$) measurement. This sequence is illustrated in FIG. 3b, showing a three level signal pulse, whereby each level is increased with respect to the previous level. A person skilled in the art will appreciate that the sequences illustrated in FIGS. 3a and 3b can be combined within a single multilevel pulse.

A multilevel test signal can also be applied to the device-under-test whereby the first level is above the trigger level of this device and hence turns the device on. The subsequent levels can be higher or lower than previous signal levels, as long as these subsequent levels are high enough to maintain the device-under-test in the on-state. Depending on the number of subsequent signal levels in this multilevel pulse only a portion, e.g. below or above the initial position of the loadline corresponding to the first signal level A1 of the test sequence, or the complete device characteristic can be determined within a single pulse having multiple levels whereby at least one level is below the previous level.

Alternative test signals can be envisaged within the scope of the invention.

Instead of having a signal pulse with multiple levels, each level having a predetermined amplitude and predetermined pulse width, one can envisage a sequence of at least one double-level pulse. The second level of each double-level pulse can then vary within this sequence; each second level then corresponding to one of the levels of a multiple level pulse after triggering the device is by the first level of this multilevel pulse. This is shown in FIG. 6a: one can apply a sequence of double-level pulses, each pulse having a pulse width t, during a first time period $t_1$ a first amplitude $A_1$ at least sufficient to trigger the device and during a second time period $t_2$ a second amplitude ($A_2$, $A_3$) below this first amplitude $A_1$ but above the maximum signal level LOW to keep the device in the on-state. In this sequence of double-level pulses the second amplitude $A_3$ applied during the second time period of one pulse can be below the second amplitude $A_2$ applied during the second time period of the preceding pulse. As the first amplitude brings the device-under-test in triggered state, one can optionally determine a current ($I_i$) and voltage ($V_i$) measurement already at this first level $A_1$, and at this second level $A_2$. This single pulse double test level allows measuring a single point of the device characteristic if only a measurement is performed during the second level $A_{j,2}$ of each pulse j.

As shown in FIG. 6b one could also envisage applying a pulse signal having a pulse width t whereby the amplitude of the pulse has an initial value $A_1$ sufficient to trigger the device and then the signal is varied in a continuous way such that the amplitude is above the maximum signal level LOW to keep the device in the low-impedance region. At each point the measurement system will be able to measure corresponding current ($I_i$) and voltage ($V_i$) values of the device characteristic (c). Depending on the speed at which the measurement system can measure and/or collect the measurement data, the signal amplitude can be kept constant during the measurement or not. The signal pulse illustrated by FIG. 6b has a continuously varying or ramped signal level whereas the sequence of sequence signal pulses shown in FIGS. 3a and 6a comprises a series of discrete signal levels $A_1$.

As shown in FIG. 6c one can apply a multilevel pulse, whereby the first level $A_1$ triggers the device in the on-state. The second level $A_2$ is the minimal level LOW possible without turning the device off. From this point onwards the signal level can be increased stepwise as shown in FIG. 6c, i.e., a third level $A_3$ above the second level $A_2$, a fourth level $A_4$ above the third level $A_3$ etc. At each level a current-voltage measurement can be performed and the obtained results can be collected and used for further data processing. Alternatively the signal level can be increased gradually until the device breaks down. FIG. 6b shows an example of such a sloped pulse signal: the amplitude is lowered in a continuous way from one level to the subsequent one. At selected points a current-voltage measurement can be performed. Once the pulse is ended a leakage current can be performed to check whether the device-under-test has failed or not.

Previous embodiments disclose various test signals according to the present invention. The levels LOW and UP will depend on the device or circuit under study. The pulse width $t_i$ and levels width $A_i$ will depend on the overstress phenomenon under investigation. As explained previously one could use the present invention to investigate the ESD robustness of a device. In this case the total pulse width t will be in the range of a few picoseconds to hundreds of nano-seconds, but less than one microsecond.

One could also use the present invention to investigate the latch-up of a circuit. In this case the device-under-test can be a part or a complete circuit that can be triggered and which after triggering shifts also from high impedance to low impedance state. Latch-up is considered to be an event with a time characteristics ranging from microseconds up to the hundred milliseconds range, but less than a second. In this case the total pulse width T will be in the range of microseconds up to less than a second.

Figure 7:
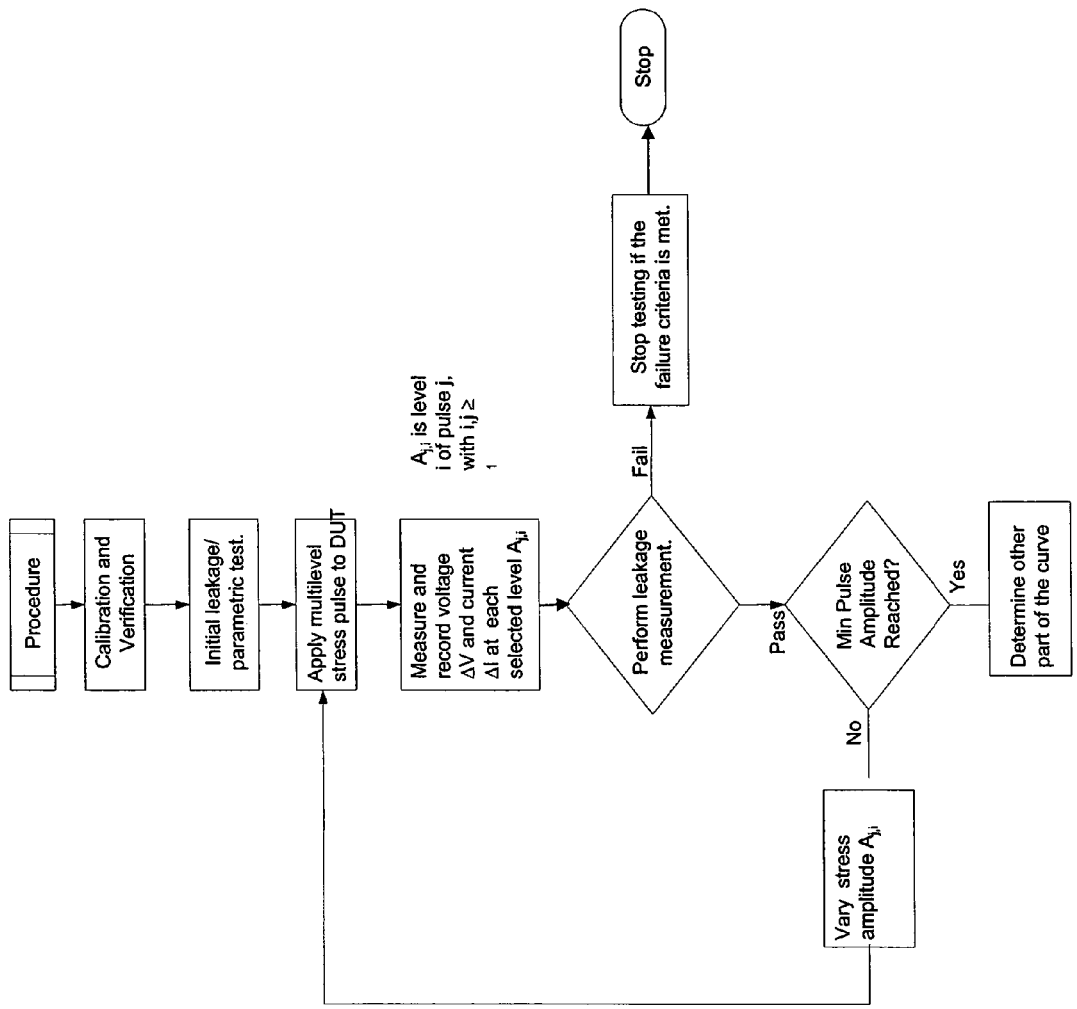
FIG. 7 shows a measurement sequence for determining current-voltages points on the snap back curve (c) according to one embodiment of the invention

FIG. 7 schematically illustrates a measurement procedure according to the present invention. The TLP system is electrically contacted to the device-under-test (DUT). Then the measurement procedure starts by first testing and calibrating the TLP measurement during the "calibration and verification phase". The initial leakage current is measured, e.g. by applying a DC voltage sweep and measuring the current through the DUT using the well-known methods and according to the relevant specifications. This leakage current measurement can be used to assess whether or not the DUT is still within the specifications. Then the test signal or stress pulse is applied to the DUT. In case of a double-pulse signal the corresponding current ($I_i$) and voltage ($V_i$) values for the second level $A_{j,2}$ are measured or optionally also for the first level $A_{j,1}$. After the removal of the test signal, the leakage current of the DUT is again determined. If the leakage current through the DUT is within a given range according to the specifications, the DUT is considered as fully functional and therefore is termed as passing the corresponding signal level stress. If the level $A_{j,2}$ was above the minimum level required to keep the device in the low impedance state, then another double-pulse signal is applied whereby the second level $A_{j+1,2}$ is lower than the second level $A_{j,2}$ of the previous double pulse. One could also vary the first level $A_{j+1,1}$, e.g. to measure a point up curve (c), but the first level can also remain fixed during the complete measurement and only the second level of the pulse is varied. Again the corresponding current (D) and voltage (V) values for the second level $A_{j,+1,2}$ are measured. This cycle is repeated until the level $A_{j,2}$ reaches the level LOW (see FIGS. 6a–c) and the DUT is no longer in the on-state during the second level. In case of a test signal having more than two amplitude levels ($A_{j,i}$ with j>1, i>2) within one pulse, then the current (I) and voltage (V) values can be determined for each selected level, including the first level. After finishing the complete pulse the leakage current of the tested device is checked.

After determining the lower part of the I-V curve of the DUT, which corresponds the region below point $V_1$, $I_1$ in FIG. 4, the upper part of the curve "c", which corresponds to the region above point $V_1$, $I_1$ in FIG. 4, can be determined also. One could also use the single pulse double-level signal of FIG. 6a whereby during the first level $A_{j,1}$ an upper point of the curve (c) is measured and during the second level $A_{j,2}$ a point of the curve (c) is measured below this upper point. This way multiple points of the device characteristic (c) are determined during a single pulse. During the loop of the flow chart of FIG. 7, both levels $A_{j,1}$ and $A_{j,2}$ can be varied, as long as the second level is below the first level. One can use any of the test sequences disclosed in the description.

In a second aspect of the invention, a measurement set-up is disclosed to determine the ESD characteristics of an over-voltage protection device, or for a device, which exhibits negative resistance behavior in its IV characteristics. This measurement system allows determining the complete or selected portions of the ESD characteristic of this ESD protection device without altering the system configuration or loadline specifications. The present invention doesn't need to change manually or under control of a computer the loadline of a TLP system. The measurement system according to this embodiment of the invention requires a single TLP system with one given loadline, which is sufficient to determine the I-V curve of the device-under-test at least from the initial loadline b down to the negative transition region.

In this second aspect of the invention an apparatus for determining the current voltage characteristic of a device, said current voltage characteristic comprising at least one negative resistance region is disclosed. This apparatus comprises means for applying at least one pulse signal of a predetermined time period to said device, said pulse signal comprising at least two consecutive levels, each level having a predetermined amplitude and predetermined pulse width, means for measuring, at least at the second level of said two consecutive levels, the current through and the voltage across the said device, characterized in that said means for applying at least one pulse signal of a predetermined time period comprise means for tuning the predetermined amplitudes of said at least two consecutive levels in a decreasing order, and said means for applying said at least one pulse signal of a predetermined time period have a given loadline.

A typical TLP measurement set-up comprises a pulse generator, delivery systems which deliver the generated pulses from the pulse generator to the device-under-test, DC leakage measurement systems which determine the leakage current of the device-under-test e.g. at after the end of the applied single double-level pulse or single multiple-level pulse, essential switching matrices or relays to select the device-under-test, probes to contact the device-under-test, cables to connect all the parts of the TLP measurement set-up, etc. A TLP system according to the present invention comprises means for generating test signals, each test signal comprising at least two amplitude levels out of which at least one amplitude level is lower than the previous amplitude level and means for conveying these test signals to the device-under-test. The TLP system according to the present invention offers one single predetermined loadline to the device-under-test.

Figure 8:
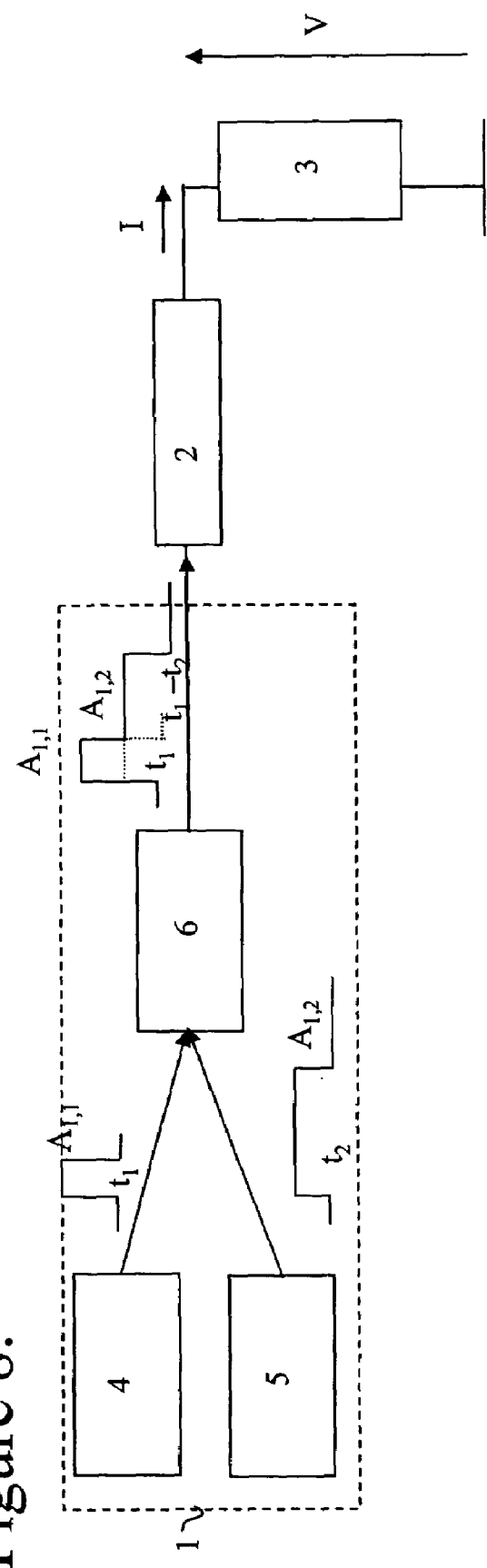

FIG. 8 shows a first alternative measurement set-up corresponding to the pulse sequence shown in FIG. 6a. A first pulse source (4) generates a first pulse having amplitude $A_1$, sufficient to trigger the device, having a pulse width $t_1$. It is desirable that this pulse width be sufficient to allow measurement of the current ($I_i$) and voltage ($V_i$) value. As will be appreciated by a person skilled in the art, depending on the properties of the TLP system and device-under-test, a stabilization time might be required after the changing the signal amplitude in order to reach an equilibrium state. For example, typically, for a standard TLP-like testing mode, a first pulse width of typically 50 nanoseconds (ns) or less, with a rise and fall time each of less than 10 ns included, can be used. A second pulse source (5) generates a second pulse having amplitude $A_2$, of pulse width '$t_2$'. For example, the second pulse can have a pulse width of less than 100 ns with a rise and fall time each of less than 10 ns. Both pulses are then combined in a adding system (6) yielding a two level pulse having a first level $A_1$ during a time period $t_1$ and a second level $A_2$ during a time period $t1-t_2$. The combined signal will then be applied to the DUT through the cable (2). In this example the loadline seen by the device-under-test is the loadline of the adder (6).

Figure 9:
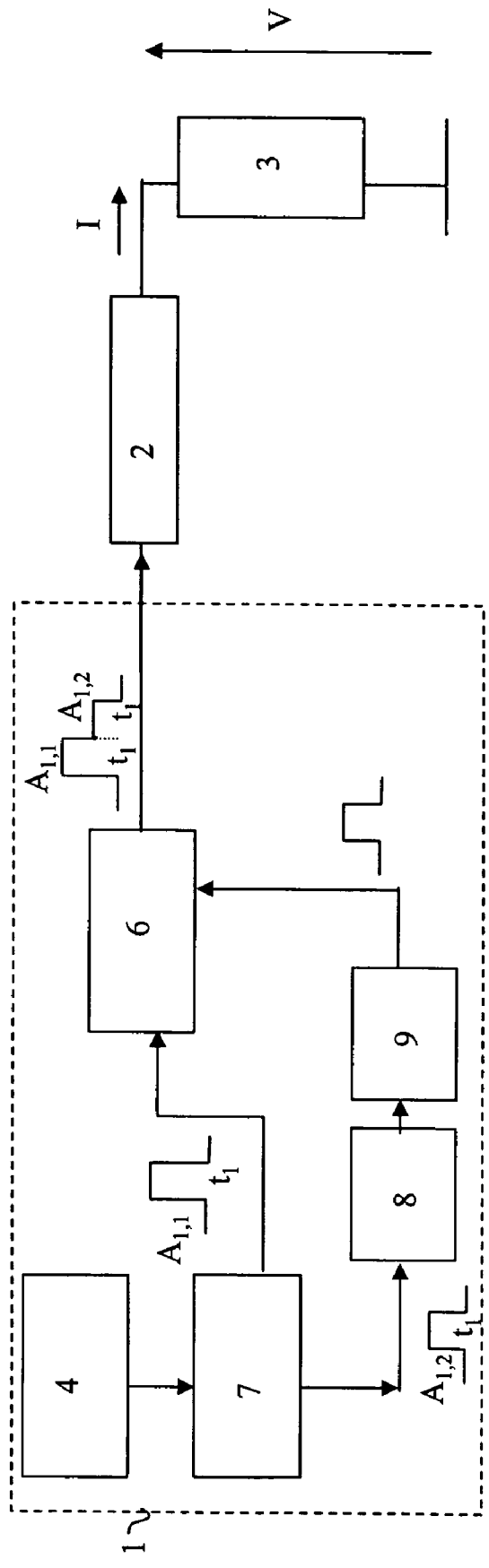
Figure 10:
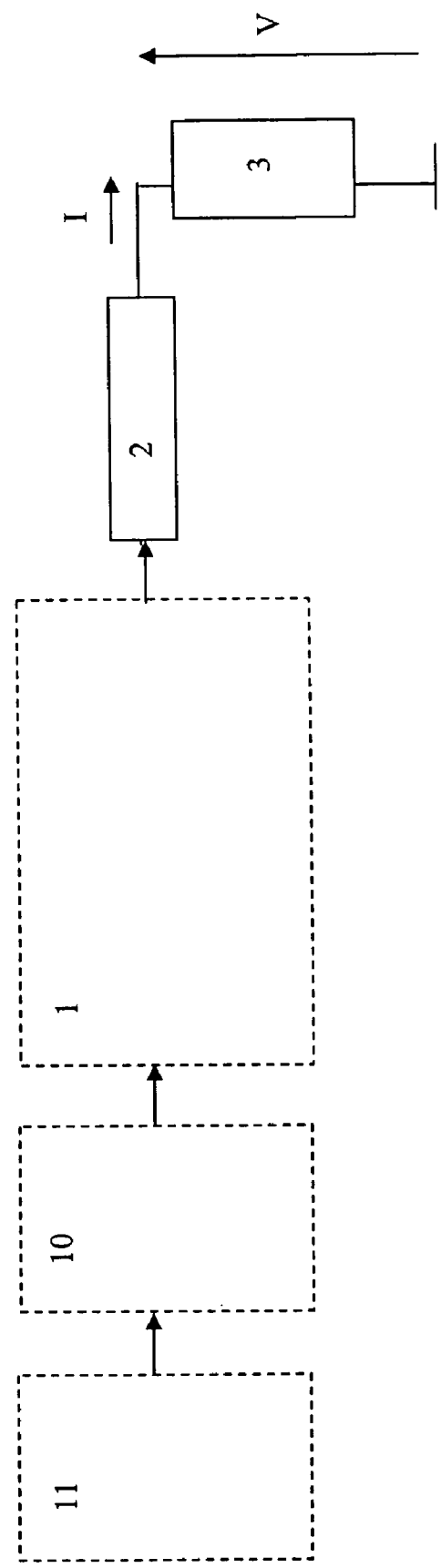
FIG. 10 shows an alternative measurement set-up under control of a computer.

FIG. 9 shows an alternative measurement set-up corresponding to the pulse sequence shown in FIG. 6a. A first pulse source (4) generates a first pulse having amplitude $A_1$, sufficient to trigger the device and having a pulse width $t_1$. This signal is fed into a power divider or splitter (7), which splits this first signal into two signals ($A_{1,1}$ and $A_{1,2}$). In the signal path of one of these two signals (e.g. $A_{1,2}$) a delay (8) is introduced as to shift and to offset both pulses to each other in time without discontinuity. It is desirable that this shift in time be sufficient to yield a pulse width $t_2$ of the second level to allow measurement of the current ($I_i$) and voltage ($V_i$) value. In the signal path of the delayed signal also an attenuator (9) is present to reduce the amplitude $A_{1,2}$ of the delayed signal to the selected amplitude $A_2$ of the second level. Both pulses are then combined (6) to obtain the double-level pulse. As outlined in the embodiment illustrated by FIG. 6a the voltage and current is measured during the lower level portion of the pulse after the higher-level portion, which triggers the device on.

The measurement set-up of the embodiments above and illustrated by FIGS. 8 and 9 may be used to execute the method illustrated by the flow chart of FIG. 7. This measurement set-up (1) might then be under control of a processor in combination with a memory device, e.g. a computer (11), in which case the measurement set-up might further comprises an interface (10) between this measurement set-up (1) and this computer (11). The processor may comprise a microprocessor, a microcontroller or any device capable of performing arithmetic, logic or control operations. The memory device may include non-volatile memory devices such as a ROM and/or volatile memory devices such as a RAM.

The software controlling the execution of the method on a measurement set-up can be represented as a sequence of binary bits maintained on a computer readable medium. Such a medium can be a program storage device readable by a machine and encoding a program of instructions for execution a method. The computer readable medium may include magnetic disks, optical disks and any other volatile, e.g. RAM, or non-volatile, e.g. ROM, firmware storage readable by the processor. The memory locations where data bits are maintained also include physical locations that have particular electrical, magnetic, optical, or organic properties corresponding to the stored data bits. The software instructions are executed as data bits by the processor with a memory system causing a transformation of the electrical signal representation, and the maintenance of the data bits at memory locations in the memory system to thereby reconfigure or otherwise alter the unit's operation. The executable software code may implement, for example, the methods as described above.

In one embodiment, the program storage device may be readable by a computer and encoding a program of instructions for executing a method by a measurement system (1) under control of this computer (11). The method may comprise: applying at least one pulse signal of a predetermined time period to said device, said pulse signal comprising at least two consecutive levels, each level having a predetermined amplitude and said predetermined amplitudes are in a decreasing order, and measuring, at least at the second level of said two consecutive levels, the current through and the voltage across said device.

In another embodiment the program storage device may be readable by a computer and encoding a program of instructions for executing a method by a measurement system (1) under control of this computer (11). The method may comprise: inputting a threshold value, applying a test sequence comprising: applying a pulse signal of a predetermined time period to said device, said pulse signal comprising at least two consecutive levels, each level having a predetermined amplitude and said predetermined amplitudes are in a decreasing order, measuring, at least at the second level of said two consecutive levels, the current through and the voltage across said device, outputting said measured current through and the voltage across the said device, thereafter measuring the leakage current through said device, outputting said leakage current, comparing said leakage current with said threshold value. The above test sequence is repeated, thereby at least varying the amplitude of said second level, until said leakage current is above said threshold value.

It should be understood that the programs, processes, methods and apparatus described herein are not related or limited to any particular type of computer or network apparatus (hardware or software), unless indicated otherwise. Various types of general purpose or specialized computer apparatus or computing device may be used with or perform operations in accordance with the teachings described herein.

It should be further understood that a hardware embodiment might take a variety of different forms. The hardware may be implemented as an integrated circuit with custom gate arrays or an applications specific integrated circuit (ASIC). The embodiment may also be implemented with discrete hardware components and circuitry. In particular, it is understood that the logic structures and method steps described in the flow diagram of FIG. 7 may be implemented in dedicated hardware such as an ASIC or as program instructions carried out by a microprocessor or other computing device. The computer (10) and the optional interface part (11) can be part of the measurement system (1) whereby the program storage device is inserted in or part of the measurement set-up (1). In case a general-purpose computer (10) is used, the program storage device is inserted in this general-purpose computer (10), which in its turn generates, in accordance with the set of instructions encoded on this program storage device, control signals to execute on a measurement-setup (1) the method according to this invention.

What is claimed is:

1. A method of determining current-voltage characteristic of a device, wherein a current-voltage relationship is characterized by at least one negative resistance region, said method comprising:

triggering said device until said device reaches an on-state;

while being in the on-state, applying at least one pulse signal of a predetermined time period to said device, each of the at least one pulse signal comprising at least two consecutive levels, each level having a predetermined amplitude and a predetermined pulse width, wherein said predetermined amplitudes of said at least two consecutive levels are in a decreasing order, wherein the transition from the first level to the second level of the at least two consecutive levels is stepwise, wherein the absolute value of said predetermined amplitudes is above zero; and measuring, at least at the second level of said two consecutive levels, the current through and the voltage across said device.

2. The method of claim 1, wherein the absolute value of amplitude of the first level of said at least two consecutive levels is above the absolute value of the trigger voltage of said device.

3. The method of claim 1, wherein the absolute value of the amplitude of the second level of said at least two consecutive levels is less than the absolute value of the trigger voltage of the device.

4. The method of claim 1, further comprising using a test system, at least for applying said at least one pulse signal, said test system having a loadline, wherein a position of said loadline on the current-voltage characteristic of said device corresponds to each of said predetermined amplitudes.

5. The method of claim 4 wherein said position of said loadline on said current-voltage characteristic is swept monotonically within said pulse signal.

6. The method of claim 4 wherein said predetermined time period is less than 1 microsecond in duration.

7. The method of claim 1, wherein the first level of said at least two consecutive levels comprises the first level of the pulse signal, and wherein applying at least one pulse signal comprises triggering said device in an on-state by selecting the absolute value of said first level to be above the absolute value of the trigger voltage of said device.

8. The method of claim 1, wherein said predetermined time period is less than 1 second in duration.

9. The method of claim 1, further comprising measuring the current through said device after removing said at least one pulse signal.

10. The method of claim 1, further comprising determining the current voltage characteristic of a snap-back device.

11. The method of claim 1, wherein the on-state of the device comprises a state during which the value of a current flowing through the device exceeds the value of a leakage current.

12. The method of claim 1, wherein the current-voltage relationship is represented by a curve in at least a two-dimensional graph.

13. A computer program product executable on a computer device, said computer program being stored in at least a memory and being configured to execute the method of claim 1 when said product is run.

14. A computer program product executable on a computer device, said computer program being storable in at least a memory and configured to determine the current-voltage characteristic of a device, wherein a current-voltage relationship is characterized by at least one negative resistance region, the computer program product performing:
triggering said device until said device reaches an on-state;
applying a pulse signal of a predetermined time period to said device, said pulse signal comprising at least two consecutive levels, each level having a predetermined amplitude and a predetermined pulse width and said predetermined amplitudes are in a decreasing order, wherein the transition from the first level to the second level of the at least two consecutive levels is stepwise;
measuring, at least at the second level of said two consecutive levels, the current through and the voltage across said device;
outputting said measured current through and the voltage across the said device;
measuring a leakage current through said device;
outputting said leakage current; and
comparing said leakage current with a threshold value.

15. The computer program product of claim 14, further performing inputting the threshold value.

16. The computer program product of claim 14, further performing varying the amplitude of said second level, until said leakage current is above said threshold value.

17. The computer program product of claim 16, wherein the on-state of the device comprises a state during which the device comprises a state during which the value of a current flowing through the device exceeds the value of the leakage current.

18. A method of determining current-voltage characteristic of a device, wherein a current-voltage relationship is characterized by at least one negative resistance region, the method comprising:
applying at least one pulse signal of a predetermined time period to the device, each of the at least one pulse signal comprising at least two consecutive levels, each level having a predetermined width and a predetermined amplitude, wherein said predetermined amplitudes of the levels are in a decreasing order in time, wherein the transition from the first level to the second level of the at least two consecutive levels is stepwise, wherein the absolute value of the predetermined amplitudes is above zero, wherein the absolute value of the amplitude of the first of the consecutive levels is above the absolute value of the trigger voltage for triggering the device in the on-state; and
while being in the on-state, measuring at least at the second level of said two consecutive levels, the current through and the voltage across said device.

19. A method of determining current-voltage characteristic of a device, wherein a current-voltage relationship is characterized by at least one negative resistance region, the method comprising:
applying at least one pulse signal of a predetermined time period to the device, each of the at least one pulse signal comprising at least two consecutive levels, each level having a predetermined width and a predetermined amplitude, wherein said predetermined amplitudes of the levels decrease stepwise in time, wherein the transition from the first level to the second level of the at least two consecutive levels is stepwise. wherein the absolute value of the predetermined amplitudes is above zero, wherein the absolute value of the amplitude of the first of the consecutive levels is above the absolute value of the trigger voltage for triggering the device in the on-state; and
while being in the on-state, measuring at least at the second level of said two consecutive levels, the current through and the voltage across said device.

20. A computer program product executable on a computer device, said computer program being storable in at least a memory and configured to determine the current-voltage characteristic of a device, wherein a current-voltage relationship is characterized by at least one negative resistance region, the computer program product performing:
triggering said device until said device reaches an on-state;
applying a pulse signal of a predetermined time period to said device, said pulse signal comprising at least two consecutive levels, each level having a predetermined amplitude and a predetermined pulse width and said predetermined amplitudes are in a decreasing order, wherein the transition from the first level to the second level of the at least two consecutive levels is stepwise, wherein the absolute value of said predetermined amplitudes is above zero;

measuring, at least at the second level of said two consecutive levels, the current through and the voltage across said device;

outputting said measured current through and the voltage across the said device;

measuring a leakage current through said device;

outputting said leakage current; and comparing said leakage current with a threshold value.

* * * * *